United States Patent
Vogel et al.

(10) Patent No.: US 7,403,875 B2
(45) Date of Patent: Jul. 22, 2008

(54) SYSTEM FOR RECONSTRUCTION OF NON-UNIFORMLY SAMPLED SIGNALS

(75) Inventors: Christian Vogel, Graz (AT); Dieter Draxelmayr, Villach (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/403,554

(22) Filed: Apr. 12, 2006

(65) Prior Publication Data

US 2007/0244669 A1    Oct. 18, 2007

(51) Int. Cl.
G06F 15/00     (2006.01)

(52) U.S. Cl. ...................................... 702/189
(58) Field of Classification Search ............. 702/189
See application file for complete search history.

(56) References Cited

U.S. PATENT DOCUMENTS 4,271,500 A * 6/1981 Fjallbrant .................... 370/210
4,704,681 A * 11/1987 Shimizu et al. .............. 600/517
7,130,396 B2 * 10/2006 Rogers et al. ............ 379/106.02

FOREIGN PATENT DOCUMENTS

EP          571075 A2 *   11/1993

OTHER PUBLICATIONS

Elbornsson, J., Gustafsson, F., Eklund, J., "Blind Adaptive Equalization of Mismatch Errors in a Time-Interleaved A/D Converter System," Jan. 2004, IEEE Transactions on Circuits and Systems—I: Regular Papers, vol. 51, No. 1, pp. 151-158.*

* cited by examiner

Primary Examiner—John E. Barlow, Jr.
Assistant Examiner—Lisa C. Sievers
(74) Attorney, Agent, or Firm—Brinks Hofer Gilson & Lione

(57) ABSTRACT

A signal processing system allows reconstruction of a non-uniformly sampled analog signal including sampling an analog signal at a sampling period of resulting in a quantized non-uniformly sampled signal. The non-uniformly sampled signal includes a sampled signal and an amplitude error between a signal sampled with the equidistant sample period and the non-uniformly sampled signal. A reconstructed amplitude error is determined through the time offset and the non-uniformly sampled signal, and is subtracted from the non-uniformly sampled signal. The signal processing system may be implemented in an electrocardiogram monitoring device or a mobile phone device.

14 Claims, 17 Drawing Sheets

SYSTEM FOR RECONSTRUCTION OF NON-UNIFORMLY SAMPLED SIGNALS

BACKGROUND

1. Technical Field

This invention generally relates to the field of sampling, and more specifically, to methods and apparatus for reconstructing non-uniformly sampled signals and to a computer program product for performing reconstruction.

2. Background Information

Monitoring systems may monitor the current status of signal amplitudes in periodic and equidistant intervals and may be used in numerous technical applications. Analog-digital converters (ADC), weather satellites, temperature sensors or even ECG monitoring are typical examples for such monitoring systems. Furthermore, Fourier techniques such as FFT (Fast Fourier Transform) or the DFT (Discrete Fourier Transform) are widely employed in signal processing and related fields, such as image analysis, speech analysis or spectroscopy to name a few. Fourier techniques may be used analyze the frequencies contained in a sampled signal, and are generally based on equidistant sampled signals. Inadequately reconstructed signals may introduce an error in any following signal processing or further application.

A periodic monitoring of the signals current state, also referred to as "sampling", that complies with the Nyquist theorem, allows a complete reconstruction of the monitored signal from the discrete sampled data. Though an ideal equidistant sampling period is a basic requirement for a full reconstruction of the sampled signal, it is very difficult to realize in technical applications. Thus, the quality of the reconstructed signal is reduced significantly if no other measures are taken into account.

FIG. 1 illustrates a uniform sampler and quantizer (Q) of an ideal sampling. Here, the value- and time-continuous analog input signal x(t) is sampled with a sample period nT and quantized, resulting in a digital output signal x[n] allowing a full reconstruction of the input signal x(t) from the digital output signal x[n].

FIG. 2 illustrates non-uniformly sampling. The input signal x(t) is sampled and quantized in non-equidistant intervals (nT+Δt[n]), resulting in an output signal x[n]+e[n] consisting of an ideal equidistant sampled signal x][n] and an amplitude error e[n], where e[n] represents the difference in amplitude between the uniformly sampled signal and the realistic non-uniformly sampled signal. Here, Δt represents the time offset from the ideal equidistant sample period nT.

FIG. 3 shows an illustrated example of an ideal equidistant sampling period (e.g. 0, 1T, 2T, 3T . . . ), the realistic non-equidistant sampling period (0+Δt[0]T, 1T+Δt[1]T, 2T+Δt[2]T, 3T+Δt[3]T . . . ) and the resulting amplitude error (e[0], e[1], e[2], e[3] . . . ).

FIG. 4 illustrates a reconstruction for time offsets, solved digitally in conventional methods. Here, a reconstructed signal $x_r[n]$ is determined from the non-uniformly sampled signal x[n]+e[n] through the known time offset Δt[n]. Ideally, the reconstructed signal $x_r[n]$ is equivalent to the signal x[n] sampled with an equidistant sample period.

Conventional methods for the reconstruction of non-uniformly sampled signals so far use multirate filterbanks, time-varying discrete time FIR filters or monitoring systems that are calibrated individually, making a generalization for any kind of monitoring system very difficult. Hence, using discrete data for the reconstruction of the signal may be promising to find a general solution by means of time discrete signal processing.

As a consequence, conventional methods used so far have disadvantages, such as the necessity for filters or filter arrays, to transform the non-uniformly sampled signal into a uniformly sampled signal, and the requirement of new filters, developed for each sample period due to different time offsets. These disadvantages may increase the complexity of the computation and, ultimately, the time needed for the reconstruction of the signal.

BRIEF SUMMARY

A signal processing method is disclosed that reconstructs a non-uniformly sampled analog signal. A quantized non-uniformly sampled signal is determined. The non-uniformly sampled analog signal includes an sampled signal and an amplitude error between a signal sampled with an equidistant sample period and the non-uniformly sampled signal.

A reconstructed amplitude error based on a time offset and the non-uniformly sampled signal is determined, and the reconstructed amplitude error is subtracted from the non-uniformly sampled signal.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

DETAILED DESCRIPTION OF THE DRAWINGS

The disclosure considers the problem of reconstructing non-uniformly sampled signals. Such situations may arise in technical applications, where an analog signal is sampled in equidistant intervals, such as in an analog-digital converter (ADC), but where the real sample period differs from the ideal uniform sample period by a time offset Δt[n]. This difference may result in an amplitude error e[n] during reconstruction of the digitally sampled signal x[n].

Figure 1:
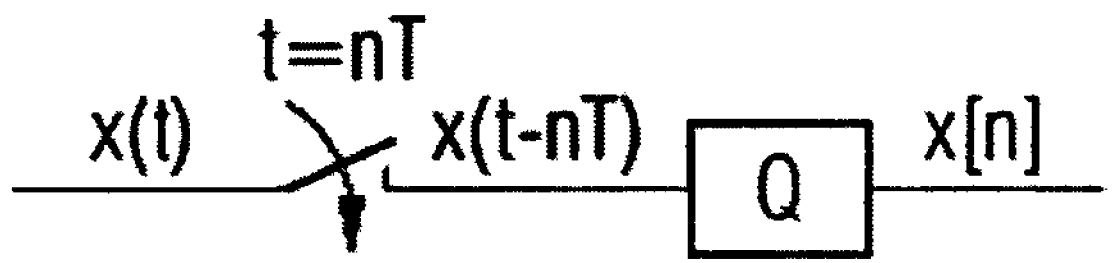
FIG. 1 illustrates uniform sampling in the related art.
Figure 2:
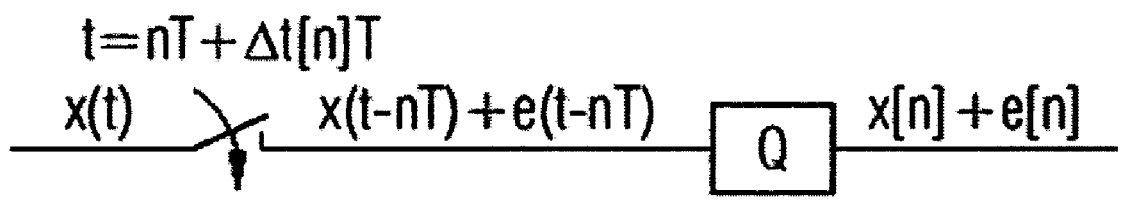
FIG. 2 illustrates non-uniform sampling in the related art.
Figure 3:
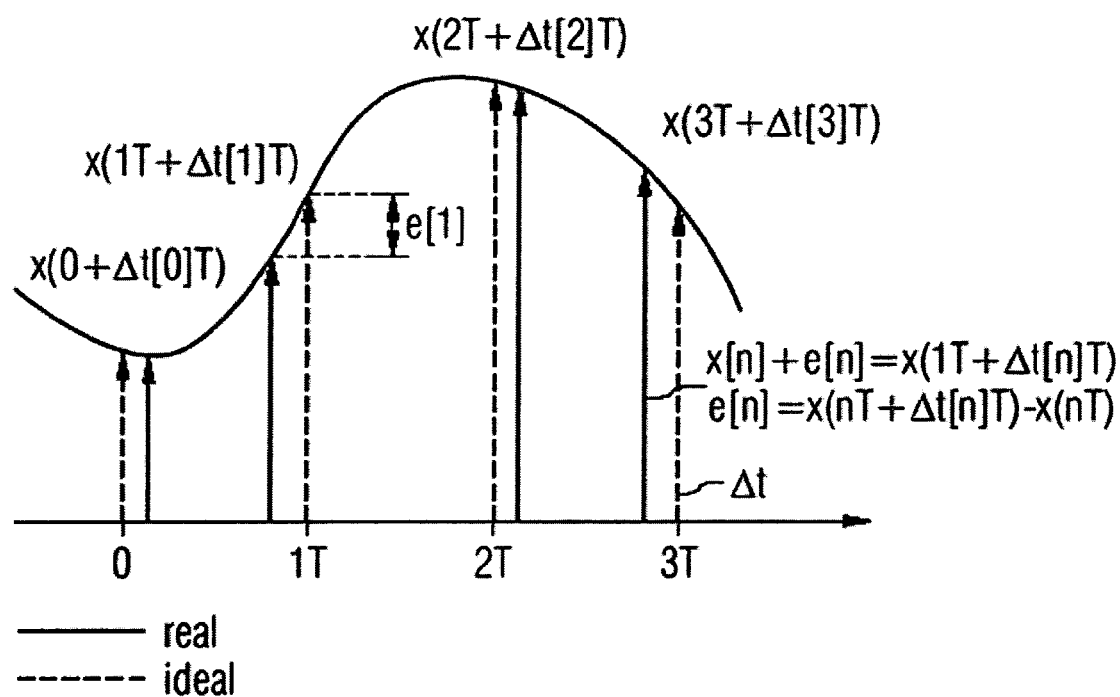
FIG. 3 shows an non-uniformly sampling in the related art.
Figure 4:
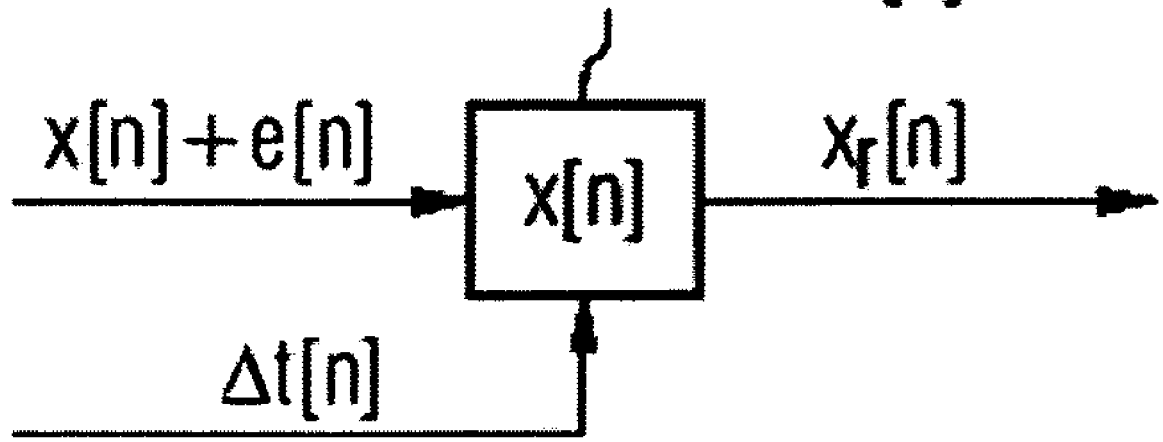
FIG. 4 illustrates a block diagram for correction of non-uniformly sampled signals in the related art.
Figure 5:
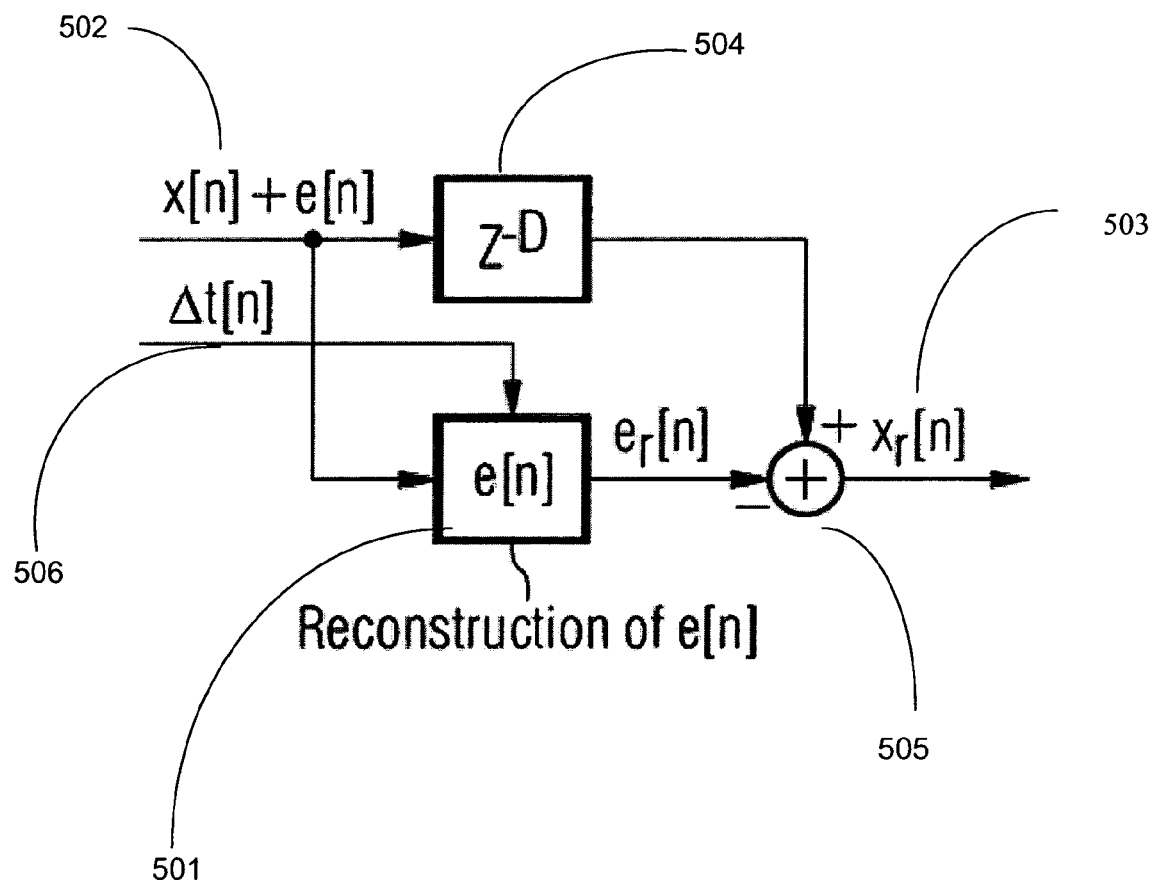
FIG. 5 illustrates an example block diagram of reconstruction of a non-uniformly sampled signal.

To minimize an amplitude error e[n], an example reconstruction system is illustrated in FIG. 5. The reconstruction system is used to reconstruct the amplitude error $e_r$[n] 501 and subtract the amplitude error $e_r$[n] 501 from the sampled signal x[n]+e[n] 502 including the amplitude error e[n] 501. The reconstruction system may include a delay unit 504 to delay the sampled signal 502 before processing the sampled signal 502 with an adder 505. The reconstructed amplitude error $e_r$[n] 501 may be based on a sample time 506, and may be equivalent to the amplitude error e[n] 501 included in the non-uniformly sampled signal x[n]+e[n] 502, resulting in a reconstructed signal $x_r$[n] 503 that may be equivalent to the uniformly sampled signal x[n]. The delay unit 504 may be implemented as an integrated circuit, such as a logic circuit, or as source code executable by a processor.

Figure 6:
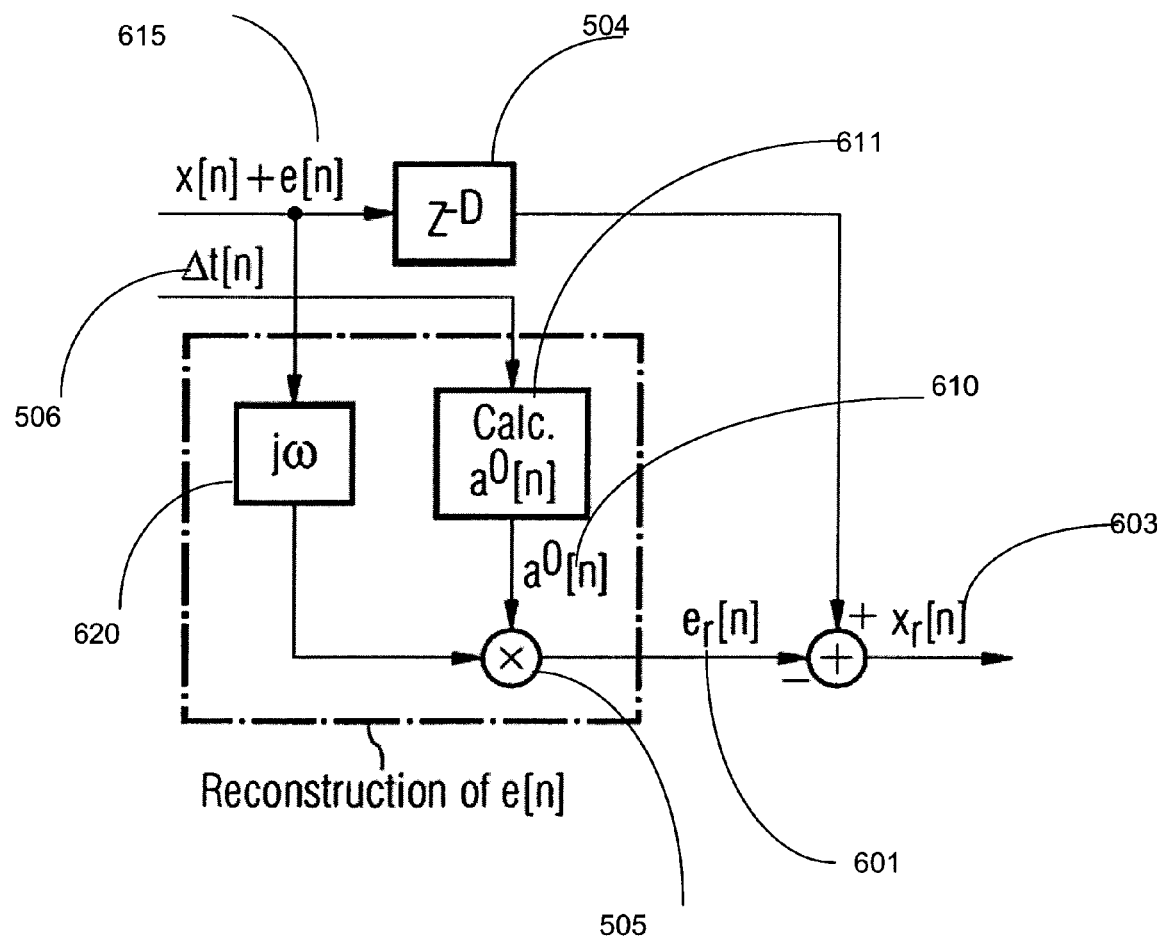
FIG. 6 illustrates an example block diagram for an evaluation unit.

FIG. 6 illustrates an example block diagram that reconstructs the amplitude error $e_r$[n] 601. The non-uniformly sampled signal x[n]+e[n] 502 is differentiated while a weighting factor, such as a0[n] 610, is calculated from the known time offset Δt[n] 506, by a calculator 611, and multiplied with the differentiated non-uniformly sampled signal x[n]+e[n] 615. The calculator 611 may be implemented as an integrated circuit, such as a logic circuit, or as source code executable by a processor.

The product $e_r$[n] [n] 601 of the weighting factor a0[n] 610 and the differentiated signal 615 may be a good approximation for the amplitude error e[n]. A significant reduction of the amplitude error is achieved by subtracting the reconstructed amplitude error from the uncorrected signal.

The weighting factors may be determined through various methods and may be the coefficients of approximating polynomials or the delayed time error Δt[n–D] in particular, where D is the time needed for the digital differentiation (jω) by a differentiator 620. Differentiators may be designed with various standard methods displaying one of the big advantages of the present invention. The entire filter design can be realized irrespective of defined time errors. A method with any complexity can be used to obtain an optimal design for an application. The actual time information, the time offset, can be considered using a time-variant multiplier. The differentiator 620 may be implemented as an integrated circuit, such as a logic circuit, or as source code executable by a processor.

The signal processing system may be applied to mobile radio transmission, image- or speech analysis systems or even astronomical observation systems, where reconstructed digitally sampled signals with minimal amplitude error would improve the quality of the output and a lower complexity of the signal processing and filter design could increase performance.

Figure 7:
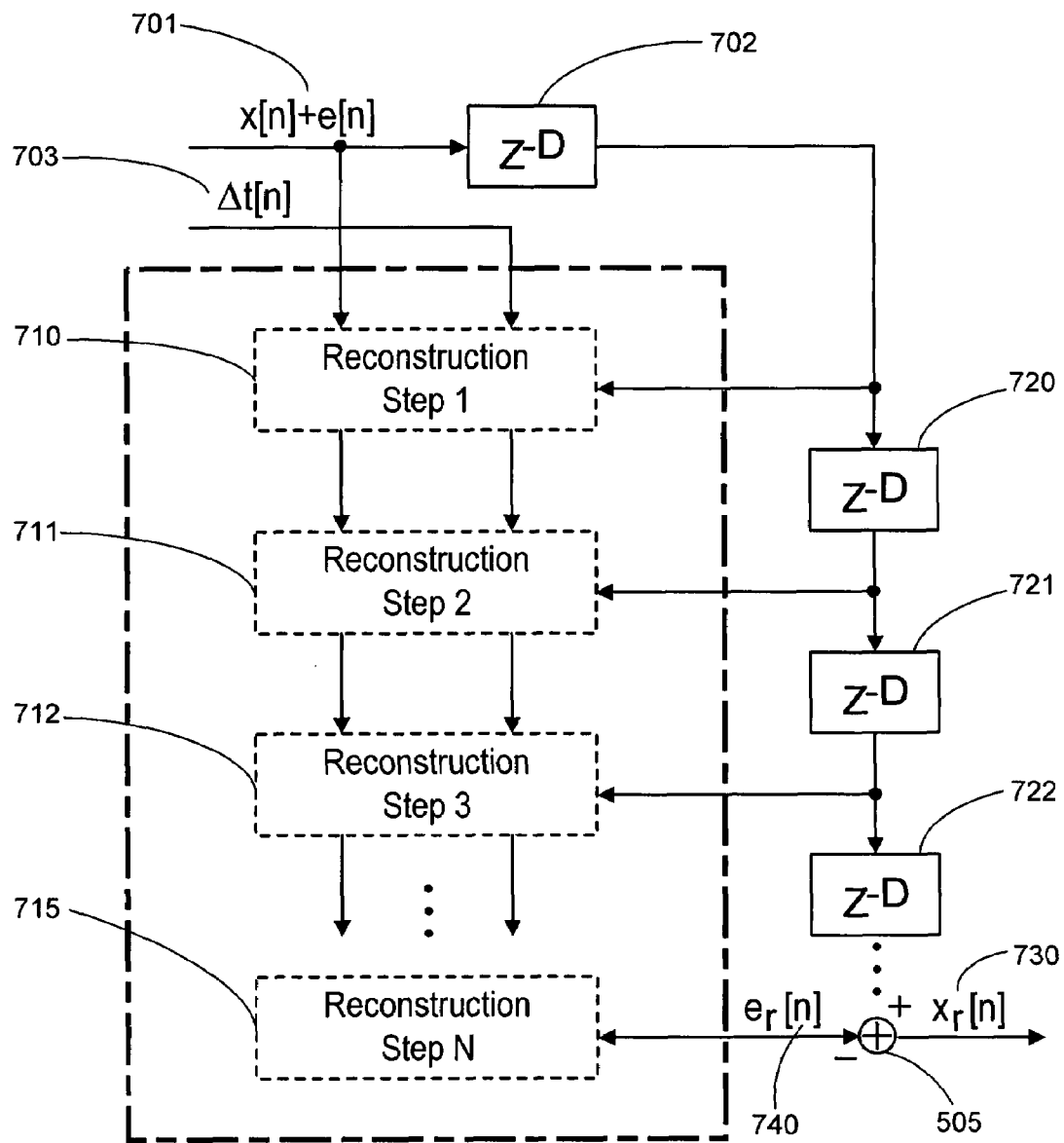
FIG. 7 illustrates an example block diagram for cascaded reconstruction steps.

FIG. 7 illustrates a plurality of cascaded reconstruction steps (710, 711, 712, 713, and 715). The cascaded reconstruction steps are used to improve the approximation of the reconstructed amplitude error $e_r$[n] [n] 740 towards the amplitude error e[n] even further. The output of the first reconstruction step (710) is differentiated at a differentiator 810 and multiplied with a weighting factor a0[n] 815 at a multiplier 816 (See FIG. 8). The weighted output 821 of the first reconstruction step is added with a delayed sampled signal, at adder 817. In a second reconstruction step (711), the delayed first signal 822 is delayed at delay unit 825, and multiplied with a second weighting factor b0[n] 830, at multiplier 832 and added to a product of another weighting factor b1[n] 831, at multiplier 833, and the twice differentiated non-uniform sampled signal x[n]+e[n] 825, at adder 834. A reconstructed amplitude error $e_r$[n] [n] 835 is subtracted from non-uniformly sampled signal x[n]+e[n] 701 that is delayed by the time D for each of the N reconstruction steps. The multiplier 830 and 832 may be implemented as an integrated circuit, such as a logic circuit, or as source code executable by a processor.

Figure 9:
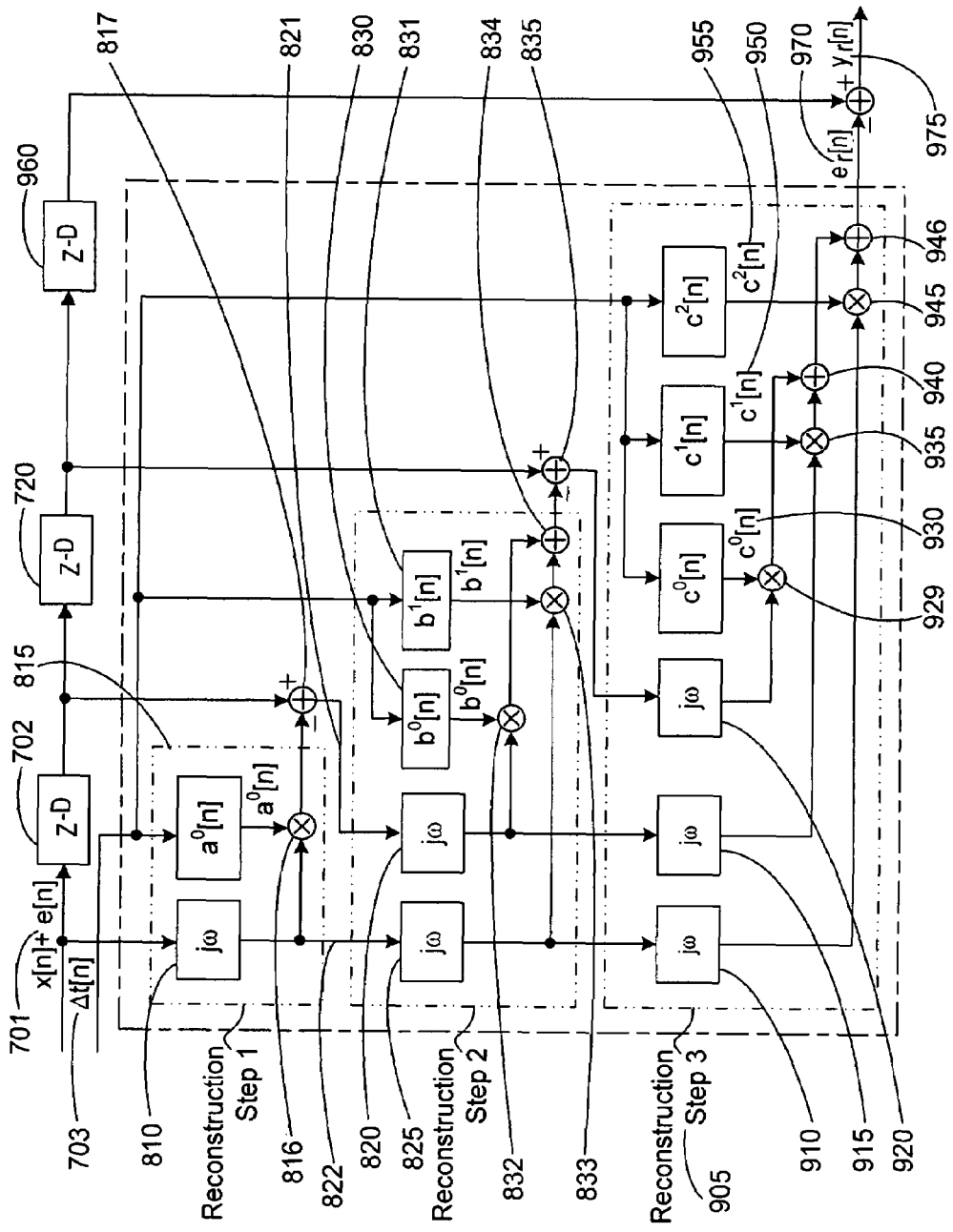
FIG. 9 illustrates an example block diagram for three cascaded reconstruction steps.

FIG. 9 illustrates the signal processing system described in FIG. 6, with three reconstruction steps. The third reconstruction stage 905 includes three delay units (910, 915, and 920). The third reconstruction stage 905 includes weighting factor units (930, 950, and 955), weighting factor multipliers (929, 935, and 945), and adders (940 and 946) for adding the outputs of the weighting factor multipliers (929, 935, and 945), respectively. The output from the third reconstruction stage 905 forms the reconstructed amplitude error $e_r$[n] [n] 970. The reconstructed amplitude error e[n] 970 is added to the output of the delay unit 960 to form the reconstructed non-uniform sampled signal 975.

Figure 11:
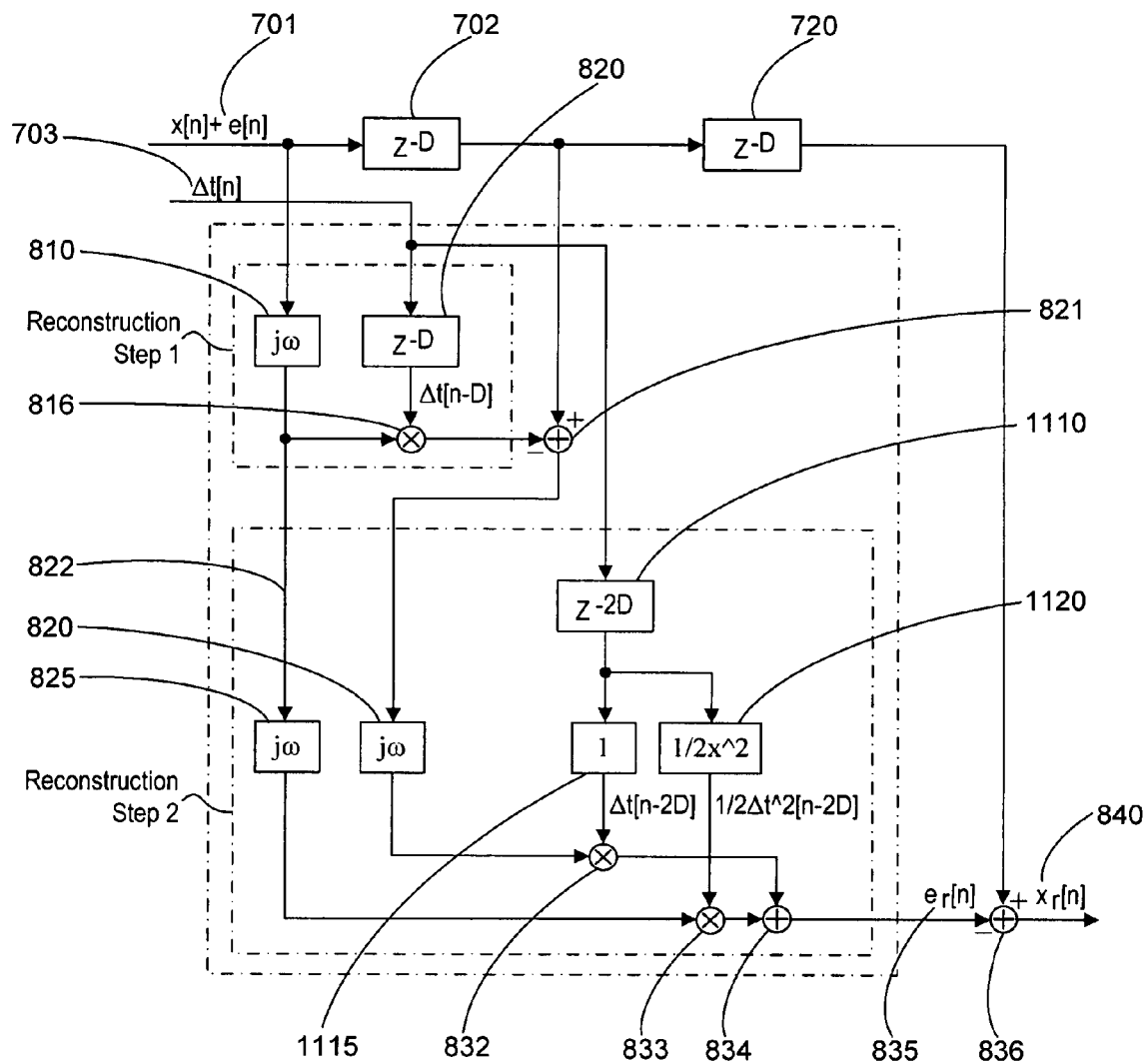
FIG. 11 illustrates an example block diagram of a calculator for the weighting factors for two reconstruction steps.

FIG. 11 illustrates a block diagram of a calculation of the weighting coefficients for two reconstruction steps. The coefficients correspond to Δt[n–sΔD]^k/k!, where k is a positive integer 1 to s, k! is the factorial of k, and s is the corresponding reconstructing step. For the first reconstruction step, a0[n]=Δt[n–D], for the second reconstruction step, $b^0$[n]=Δt[n–2·D] 1115 (after delay unit 1110) and $b^1$[n]=Δt[n–2·D]^2/2 1120, for the third reconstruction step, $c^0$[n]=Δt[n–3·D], $c^1$[n]=Δt[n–3·D]^2/2 and $c^2$[n]=Δt[n–3·D]^3/6, for the fourth reconstruction step, $d^0$[n]=Δt[n–4·D], $d^1$[n]=Δt[n–4·D]^2/2, $d^2$[n]= Δt[n–4·D]^3/6 and $d^3$[n]=Δt[n–4·D]Δ4/24 etc. The concept may be applied to any number of reconstruction steps.

Figure 8:
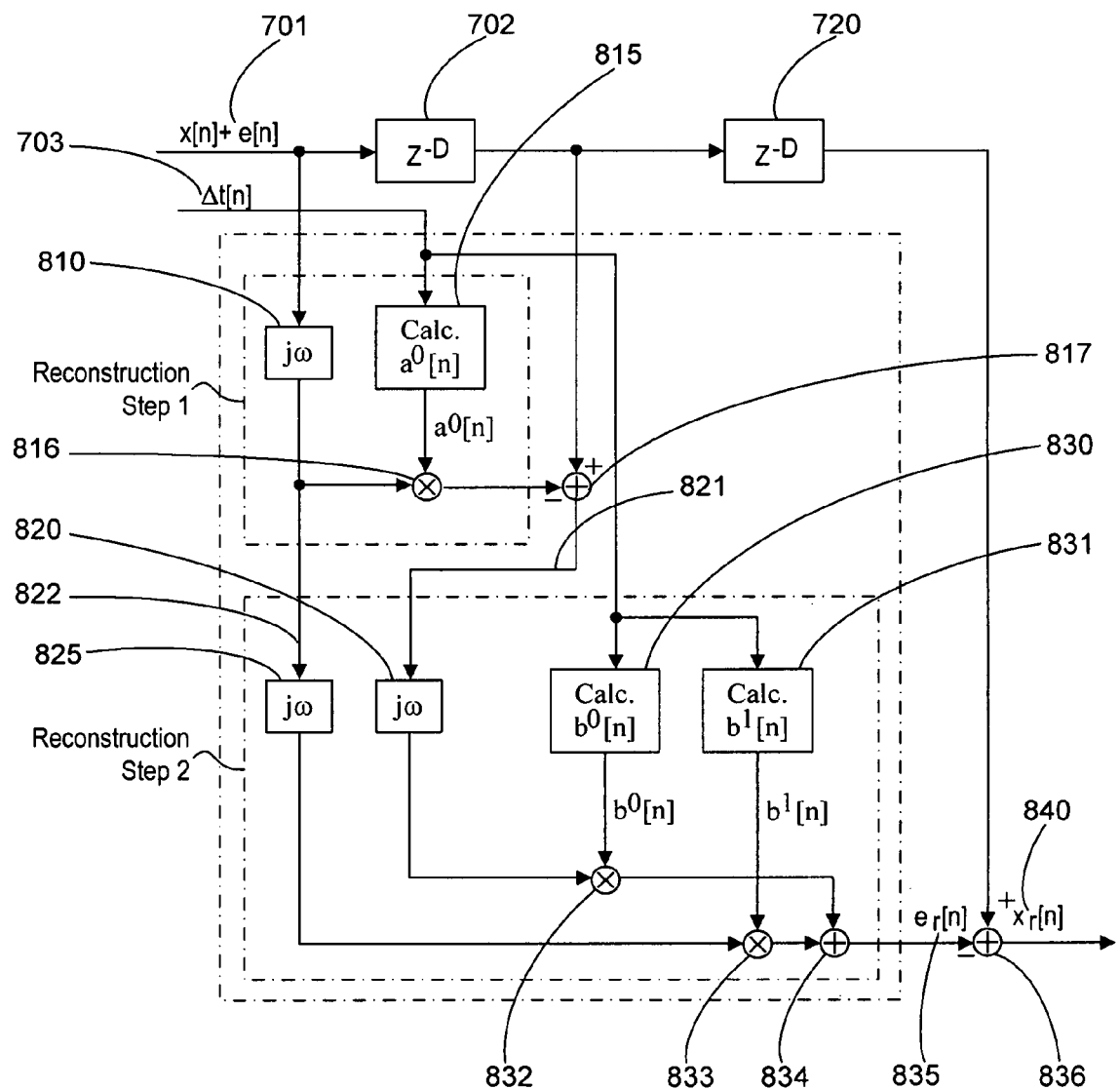
FIG. 8 illustrates an example block diagram for two cascaded reconstruction steps.
Figure 10:
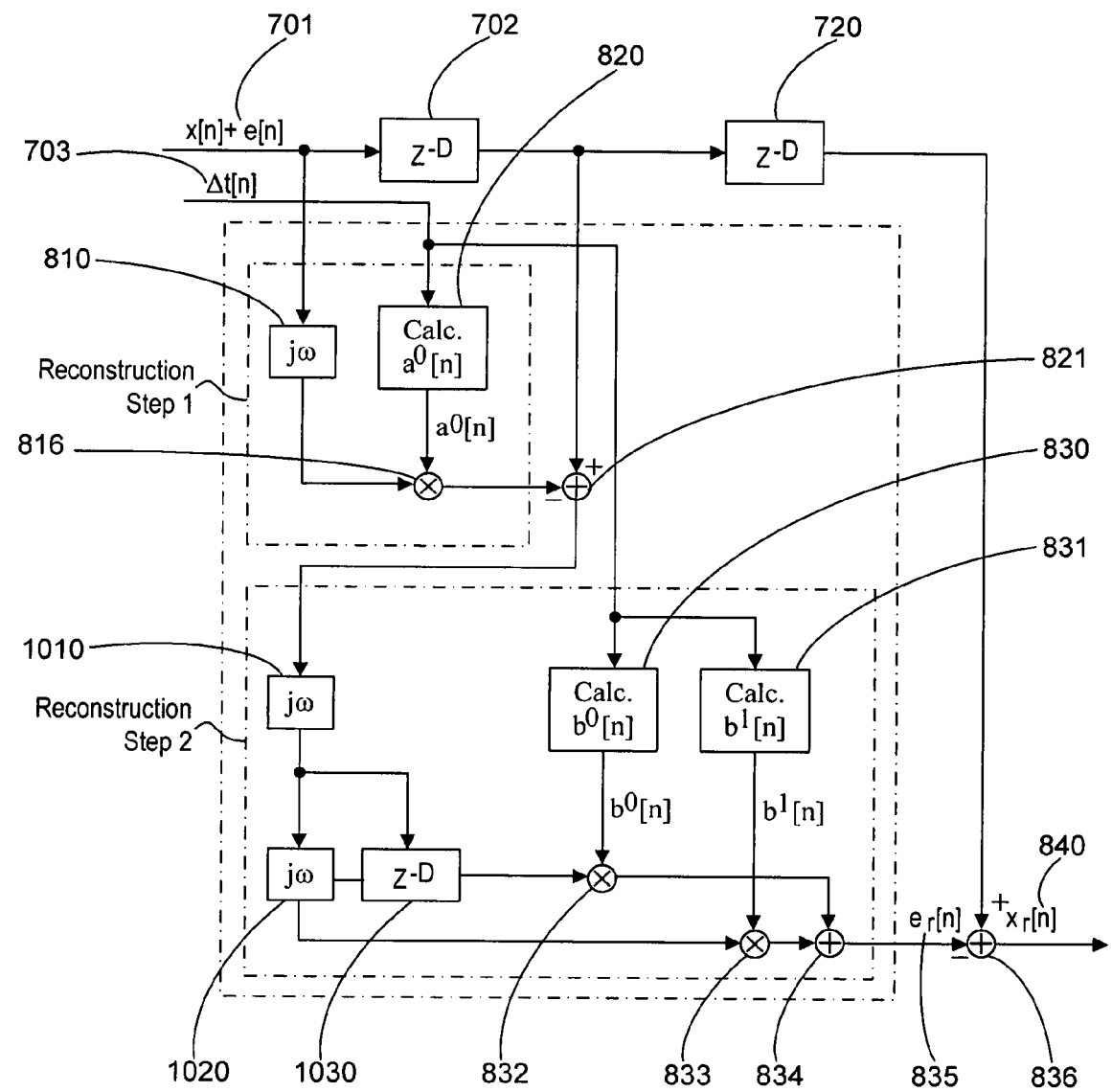
FIG. 10 illustrates an example block diagram for two cascaded reconstruction steps with two differentiators connected in series in the second reconstruction step.

FIG. 10 shows an example signal processing system 1000 that differs from the example signal processing system described in FIG. 8 in that the second and each of the following reconstruction steps comprise differentiators (jω) 1010 and 1020 that are connected in series. The amplitude error e[n] may be calculated more precisely with a lower number of reconstruction steps. However, additional delaying means ($Z^{-D}$) 1030 are necessary for each reconstruction step and the total time needed for the reconstruction increases.

Figure 12:
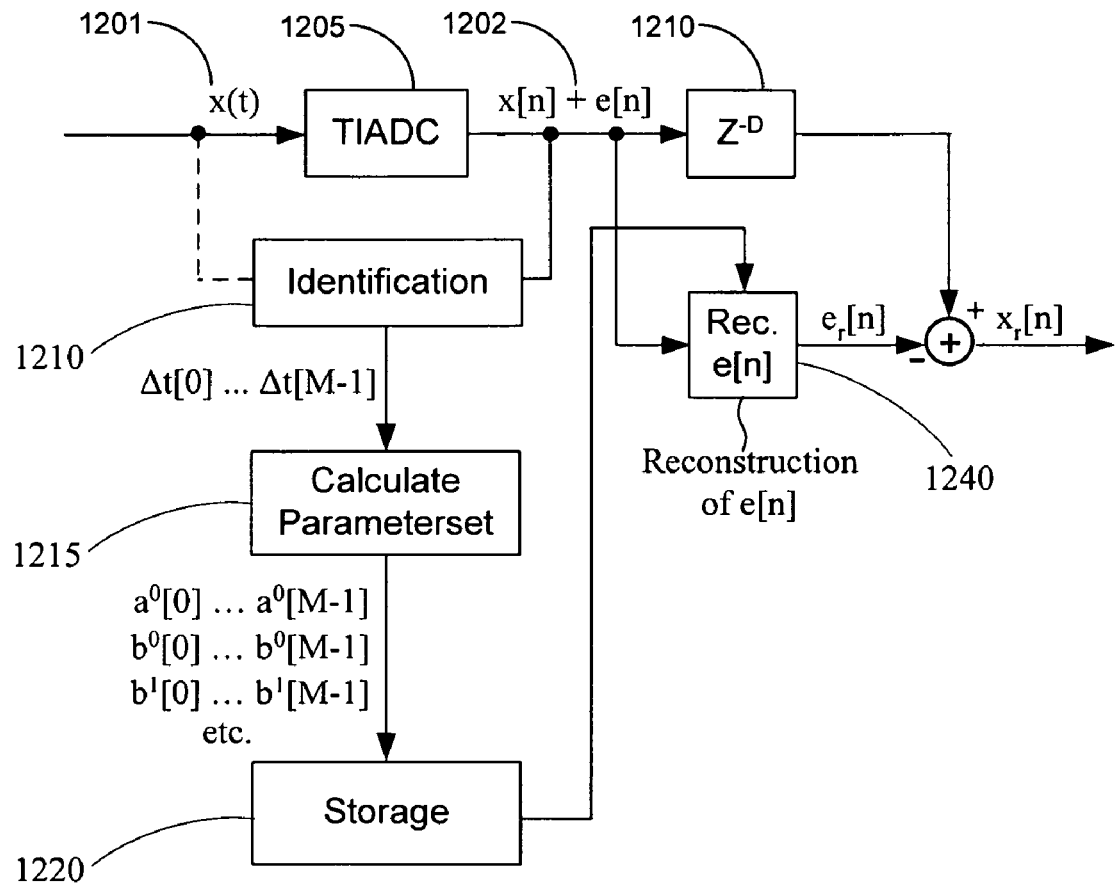
FIG. 12 illustrates an example block diagram of a time interleaved ADC.

FIG. 12 shows an example application of the signal processing system described in FIG. 8. The sampling system includes a time interleaved ADC (TI-ADC) 1205 having a time offset 1210 for each of a plurality of sample channels. A periodic sequence of time offsets Δt[n] is the result and the period depends on the number of channels M. Hence, Δt[n]=Δt[n–M] for all n. An identification unit 1212 may function to process the input signal 1201 and the sampled signal 1202 to output a signal to the parameter calculation unit 1215. A parameter set from the time offsets can be calculated at the parameter calculation unit 1215 and stored in an array storage 1220. The parameters do not have to be recalculated unless the time offset changes due to temperature alterations or deterioration. Since those changes are slow compared to the sampling rate of TI-ADC's the clock speed of the time offset calculations can be very low. A reconstruction unit 1240 is operable to reconstruct the error signal based on the stored parameters from array storage.

Figure 13:
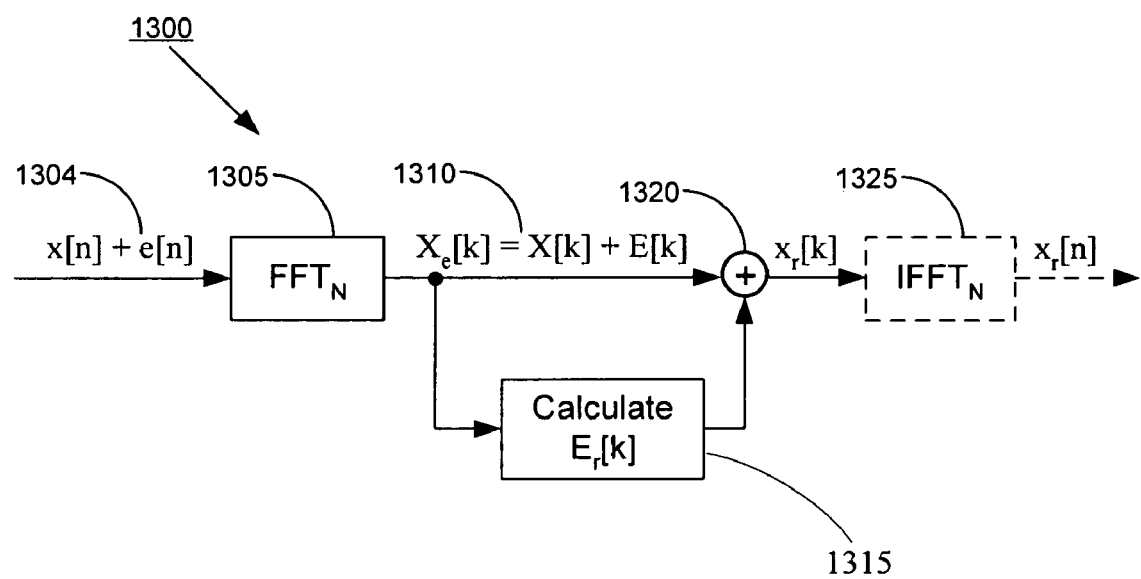
FIG. 13 illustrates an example block diagram of a reconstruction of a signal in the frequency domain.

FIG. 13 shows an example signal processing system 1300, where the amplitude error is determined and subtracted in the frequency domain. The reconstruction in the frequency domain may be beneficial for applications such as OFDM (orthogonal frequency-division multiplexing), where a FFT signal (or IFFT signal) is generated already during signal modulation. For that purpose the non-uniformly sampled signal 1301 is transformed, at FFT 1305 into a Discrete-Fourier- Transformed (DFT) signal 1310 for N values resulting in a signal $X_e[k]=X[k]+E[k]$, where k is a positive integer. The amplitude error $E_r[k]$ is reconstructed, at reconstruction unit 1315 and subtracted from $X_e[k]$, at adder 1320. In an ideal case, $E_r[k]$ is equivalent to $E[k]$ resulting in an ideal output signal that is equivalent to $X[k]$. The signal can be transformed back into the time domain if necessary, at an inverse FFT unit 1325.

Figure 14:
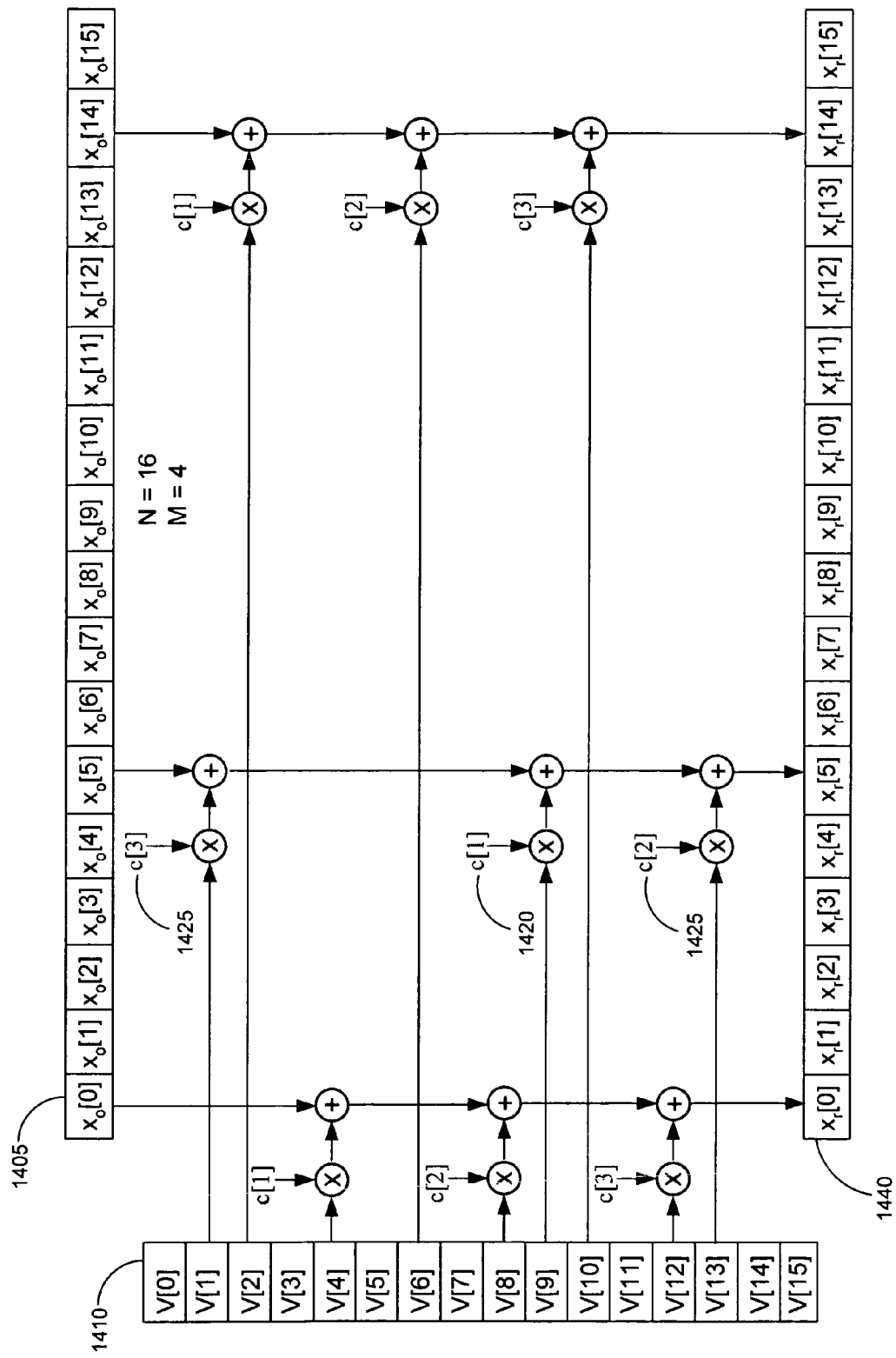
FIG. 14 shows an example block diagram with multiple channels and multiple samples.

FIG. 14 shows an example application of the signal processing system 1300, used in the frequency domain for M=4 channels and N=16 samples. For clarity, only three DFT values are shown in the reconstruction. Here, coefficients V[k] 1410 are weighted (multiplied) with IFFT (inverse fast fourier transformed) coefficients C[k] (1420, 1425, and 1430) and added to the uncorrected fast fourier transformed (FFT) signal $Xe[k]=X[k]+E[k]$ 1405. The reconstructed sampled signal Xr[k] 1440 results from this addition.

Figure 16:
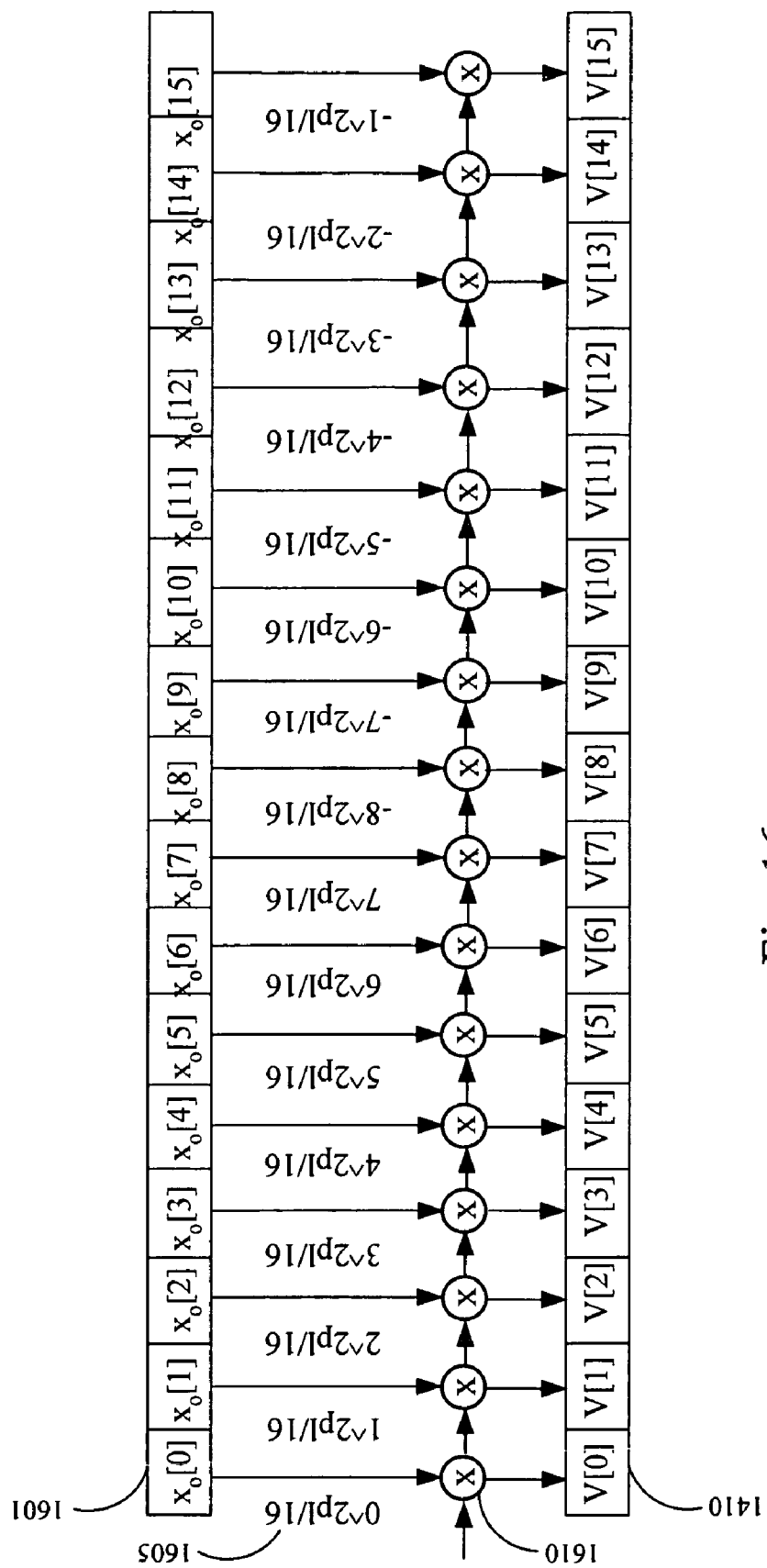
FIG. 16 illustrates an example block diagram for the calculation of coefficients.

The coefficients V[k] 1410 are determined as shown in FIG. 16. The array of sampled signal values x[k] 1601 are multiplied by the FFT factors 1605 ($n[k]^2*\pi/16$, where n[k] are shown in FIG. 16). The FFT factors 1605 are multiplied with the sampled signal values 1601 at multipliers 1610, to generate V[k] 1410.

Figure 15:
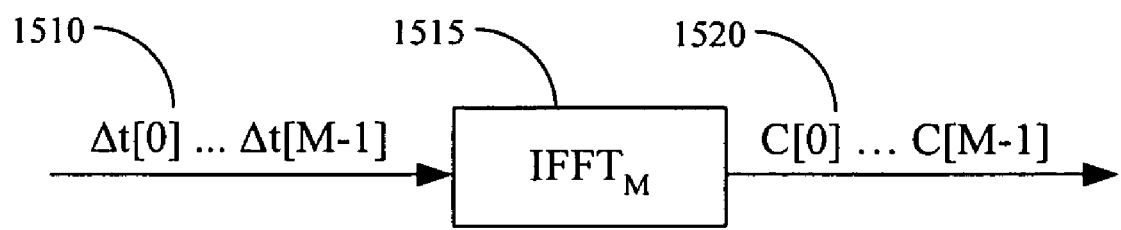
FIG. 15 illustrates an example block diagram of a calculation of polynomial coefficients.

The coefficients C[k] (1420, 1425, and 1430) are determined as shown in FIG. 15. Time delay values 1510 are provided to an inverse FFT unit 1515. The output of the inverse FFT unit 1515 is the coefficient array C[k] (1420, 1425, and 1430).

The sum of the terms added to the uncorrected signal Xe[k] is equivalent to the reconstructed error Er[k], which is added in the example of FIG. 14 since the algebraic sign of C[k] is interchanged. Generally, M and N can have any number as long as the ratio N/M is an integer.

The signal processing system shown in FIG. 14 allows a simultaneous calculation of all $X_e[k]$. The values of $X_e[k]$ may also be calculated consecutively, where the coefficients V[k] do not need to be stored. Furthermore, the reconstruction of the amplitude error can be cascaded into a plurality of steps as already shown for the methods used in the time domain. No delaying units ($Z^{-D}$) are necessary for the reconstruction in the frequency domain.

The following computer program shows an example signal processing system. A Matlab code function shows a description for any N and M:

```
Function xc = Remove(xe, dt)
M = length(dt);
N = length(xe);
Xe = fft(xe);
dT = ifft(dt);
    Xc = zeros(N, 1);
    for k = 0:N-1;
        E = 0;
        for m = 1:M-1;
            l = k+m*N/M;
            h = 2*Pi/N*mod(l+N/2,N)-Pi;
            g = mod(l, N);
            E = E + j*h*Xe(g+1)*dT(m+1),
        end
        Xc(k+1) = Xe(k+1)+E;
    end
xc = real(ifft(Xc));
return
```

Figure 17:
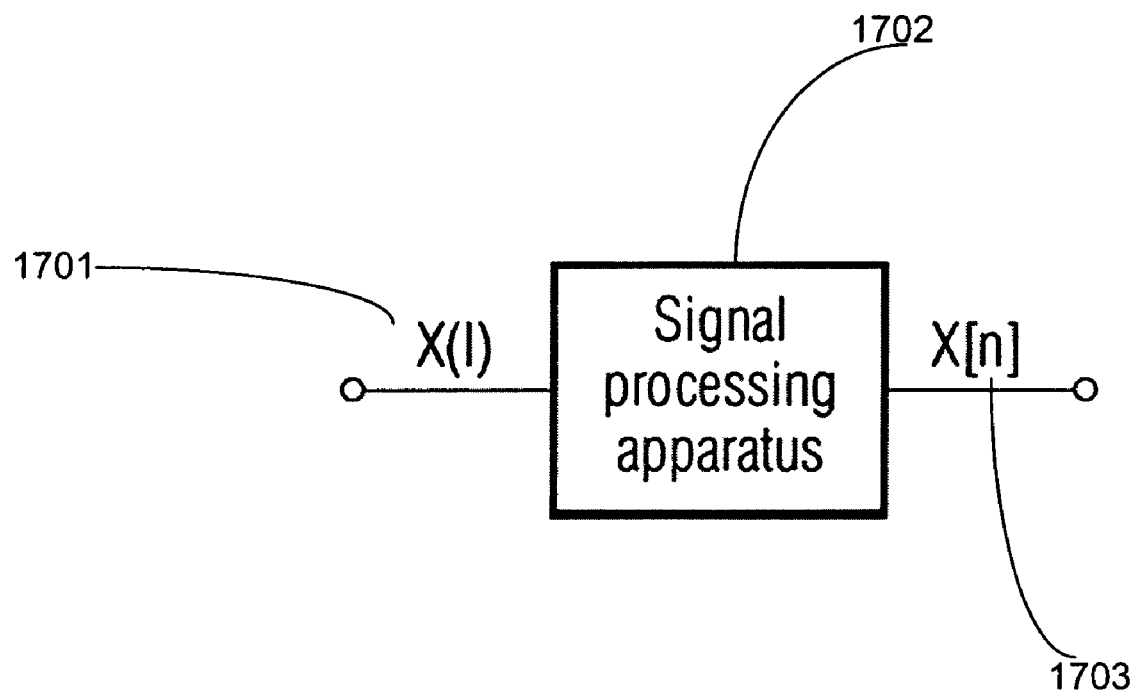
FIG. 17 illustrates a signal processing apparatus.

FIG. 17 illustrates an example signal processing system. An input signal x[1] 1701 may be supplied to a signal processor 1702. The signal processor 1702 may be configured to execute the signal processing methods described in FIGS. 5-16, in particular, sampling the input signal 1701 and producing a non-uniformly sampled signal 1703. The signal processor 1702 may then output the non-uniformly sampled signal 1703. Examples of signal processing systems 1702 include an electrocardiogram (ECG) monitoring device, a mobile phone, a video processor, or other signal processing apparatus that may require non-uniform sampling of a signal.

A signal processing system may include an ECG monitoring device including a fixed filter device as shown in FIG. 6 or FIG. 7. The fixed filter device may minimize the need for additional filters, which would have further degrading effects, such as phase shifts, onto the recorded ECG signal.

A signal processing system may include a mobile phone including a signal processing apparatus, minimizing the need for additional filters and making the mobile phone simpler and less expensive.

The signal processing acts may be encoded in a signal bearing medium, a computer readable medium such as a memory, programmed within a device such as one or more integrated circuits, or processed by a controller or a computer. If the methods are performed by software, the software may reside in a memory resident to or interfaced to the signal processing system, a communication interface, or any other type of non-volatile or volatile memory interfaced or resident to the signal processing system. The memory may include an ordered listing of executable instructions for implementing logical functions. A logical function may be implemented through digital circuitry, through source code, through analog circuitry, or through an analog source such as through an analog electrical, audio, or video signal. The software may be embodied in any computer-readable or signal-bearing medium, for use by, or in connection with an instruction executable system, apparatus, or device. Such a system may include a computer-based system, a processor-containing system, or another system that may selectively fetch instructions from an instruction executable system, apparatus, or device that may also execute instructions.

A "computer-readable medium," "machine-readable medium," "propagated-signal" medium, and/or "signal-bearing medium" may comprise any unit that contains, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM" (electronic), a Read-Only Memory "ROM" (electronic), an Erasable Programmable Read-Only Memory (EPROM or Flash memory) (electronic), or an optical fiber (optical). A machine-readable medium may also include a tangible medium upon which software is printed, as the software may be electronically stored as an image or in another format (e.g., through an optical scan), then compiled, and/or interpreted or otherwise processed. The processed medium may then be stored in a computer and/or machine memory.

It will be obvious that the disclosure may be varied in a number of ways. Such variations are not to be regarded as a departure from the scope of the disclosure. All such modifications as would be obvious to one skilled in the art are intended to be included within the scope of the appended claims.

It is therefore intended that the foregoing detailed description be regarded as illustrative rather than limiting, and that it be understood that it is the following claims, including all equivalents, that are intended to define the spirit and scope of this invention.

The invention claimed is:

1. A method that reconstructs a non-uniformly sampled analog signal, comprising:
sampling a signal, with an equidistant sample period, by at least one of an analog-digital converter or a time interleaved analog-digital converter;
determining a quantized non-uniformly sampled signal comprising the sampled signal with an amplitude error between the signal, and the non-uniformly sampled signal;
minimizing the amplitude error by determining a reconstructed amplitude error based on a time offset and the non-uniformly sampled signal, where determining a reconstructed amplitude error comprises:
differentiating the non-uniformly sampled signal; and
multiplying the non-uniformly sampled signal with a weighting factor, where the weighting factor is determined from the time offset using one or more coefficients of approximating polynomials;
delaying the non-uniformly sampled signal by a delay time needed to reconstruct the amplitude error;
subtracting the reconstructed amplitude error from the non-uniformly sampled signal to form a reconstructed non-uniformly sampled signal; and
outputting the reconstructed non-uniformly sampled signal.

2. The method according to claim 1, where determining the reconstructed amplitude error comprises delaying, by a cascade time, the subtracting of the reconstructed amplitude error from the non-uniformly sampled signal.

3. The method according to claim 1, where determining the reconstructed amplitude error comprises transforming the non-uniformly sampled signal into a discrete-fourier-transformed signal using a plurality of samples, where the plurality of samples comprises a positive integer.

4. The method according to claim 3, where determining the reconstructed amplitude error comprises determining the reconstructed amplitude error through a plurality of cascaded reconstruction steps in the frequency domain.

5. The method according to claim 1, where sampling the analog signal comprises sampling every channel by a TI-ADO with an individual time offset based on a number of channels, determining weighting factors used for the reconstruction of the amplitude error according to a number of cascaded reconstruction steps, and storing the weighting factors.

6. A signal processing apparatus that reconstructs a non-uniformly sampled analog signal, sampled by at least one of an analog-digital converter or a time interleaved analog-digital converter, comprising:
an input operable to receive an analog signal;
an output configurable to provide a digital output signal;
an evaluator operable to reconstruct and minimize an amplitude error based on a time offset and the non-uniformly sampled signal, the evaluator comprising:
a differentiator operable to differentiate the non-uniformly sampled signal; and
a multiplier operable to perform a subsequent multiplication of the non-uniformly sampled signal with a weighting factor, where the weighting factor is determined from the time offset using a plurality of coefficients of approximating polynomials;
a delay unit operable to delay the non-uniformly sampled signal by a delay time needed to reconstruct the amplitude error;
a subtract unit operable to subtract the amplitude error from the non-uniformly sampled signal to form a reconstructed non-uniformly sampled signal; and
an output configurable to output the reconstructed non-uniformly sampled signal.

7. A signal processing apparatus according to claim 6, where the evaluator is operable to execute a plurality of cascaded reconstruction steps, further comprising: a delay unit operable to delay the non-uniformly sampled signal by a cascade time based on the cascaded reconstruction steps; and where the subtract unit is operable to subtract the reconstructed amplitude error from the delayed non-uniformly sampled signal.

8. A signal processing apparatus according to claim 6, where the evaluator is operable to execute a reconstruction step in a frequency domain, comprising:
a transforming unit operable to transform the non-uniformly sampled signal into a discrete-fourier-transformed signal based on a plurality of samples, where the plurality of sample comprises a positive integer;
a calculator operable to determine the reconstructed amplitude error; and
a subtract unit operable to subtract the reconstructed amplitude error from the discrete-fourier-transformed signal.

9. A signal processing apparatus according to claim 8, where the evaluator is operable to execute a plurality of cascaded reconstruction steps in the frequency domain.

10. An electrocardiogram monitoring device that reconstructs a non-uniformly sampled analog signal, sampled by at least one of an analog-digital converter or a time interleaved analog-digital converter, comprising:
an input operable to receive an analog signal;
an output configurable to provide a digital output signal;
an evaluator operable to reconstruct and minimize an amplitude error based on a time offset and the non-uniformly sampled signal, the evaluator comprising:
a differentiator operable to differentiate the non-uniformly sampled signal; and
a multiplier operable to perform a subsequent multiplication of the non-uniformly sampled signal with a weighting factor, where the weighting factor is determined from the time offset using a plurality of coefficients of approximating polynomials;
a delay unit operable to delay the non-uniformly sampled signal by a delay time needed to reconstruct the amplitude error;
a subtract unit operable to subtract the amplitude error from the non-uniformly sampled signal to form a reconstructed non-uniformly sampled signal; and
an output configurable to output the reconstructed non-uniformly sampled signal.

11. A mobile phone that reconstructs a non-uniformly sampled analog signal, sampled by at least one of an analog-digital converter or a time interleaved analog-digital converter, comprising:
an input operable to receive an analog signal;
an output configurable to provide a digital output signal;
an evaluator operable to reconstruct and minimize an amplitude error based on a time offset and the non-uniformly sampled signal, the evaluator comprising:
a differentiator operable to differentiate the non-uniformly sampled signal; and
a multiplier operable to perform a subsequent multiplication of the non-uniformly sampled signal with a weighting factor, where the weighting factor is determined from the time offset using a plurality of coefficients of approximating polynomials;

a delay unit operable to delay the non-uniformly sampled signal by a delay time needed to reconstruct the amplitude error;

a subtract unit operable to subtract the amplitude error from the non-uniformly sampled signal to form a reconstructed non-uniformly sampled signal; and an output configurable to output the reconstructed non-uniformly sampled signal.

12. A computer program product comprising:

a computer useable medium having computer readable code embodied in the medium, the computer readable code comprising:

computer readable code executable to sample a signal by a at least one of a analog-digital converter or a time interleaved analog-digital converter;

computer readable code executable to determine a quantized non-uniformly sampled signal comprising a sampled signal and an amplitude error between a signal sampled with an equidistant sample period and the non-uniformly sampled signal;

computer readable code executable to minimize the amplitude error by determining a reconstructed amplitude error based on the time offset and the non-uniformly sampled signal, where determining a reconstructed amplitude error comprises differentiating the non-uniformly sampled signal and multiplying the non-uniformly sampled signal with a weighting factor, where the weighting factor is determined from the time offset using a plurality of coefficients of approximating polynomials;

computer readable code executable to subtract the reconstructed amplitude error from the non-uniformly sampled signal to form a reconstructed non-uniformly sampled signal and;

computer readable code executable to output the reconstructed non-uniformly sampled signal.

13. A signal processing apparatus that reconstructs a non-uniformly sampled analog signal, sampled by at least one of an analog-digital converter or a time interleaved analog-digital converter, a sampling period comprises a period, comprising:

input means for receiving an analog signal;

means for providing a digital output signal;

evaluation means for reconstructing and minimizing an amplitude error based on the time offset and the non-uniformly sampled signal, the evaluation means comprising:

differentiating means for differentiating the non-uniformly sampled signal; and multiplying means for multiplying the non-uniformly sampled signal with a weighting factor, where the weighting factor is determined from the time offset using a plurality of coefficients of approximating polynomials;

delay means for delaying the non-uniformly sampled signal by a delay time needed to reconstruct the amplitude error;

subtraction means for subtracting the amplitude error from the non-uniformly sampled signal to form a reconstructed non-uniformly sampled signal; and means for outputting the reconstructed non-uniformly sampled signal.

14. A method that reconstructs a non-uniformly sampled analog signal, comprising:

determining a quantized non-uniformly sampled signal comprising a sampled signal and an amplitude error between a signal and the non-uniformly sampled signal, where the signal is sampled with an equidistant sample period;

minimizing the amplitude error by determining a reconstructed amplitude error based on a time offset and the non-uniformly sampled signal, where determining the reconstructed amplitude error comprises:

differentiating the non-uniformly sampled signal; and multiplying the non-uniformly sampled signal with a weighting factor, where the weighting factor is determined from the time offset using one or more coefficients of approximating polynomials;

delaying the non-uniformly sampled signal by a delay time needed to reconstruct the amplitude error; and subtracting the reconstructed amplitude error from the non-uniformly sampled signal to form a reconstructed non-uniformly sampled signal.

* * * * *